United States Patent [19]
Birleson

[11] Patent Number: 5,847,612
[45] Date of Patent: Dec. 8, 1998

[54] INTERFERENCE-FREE BROADBAND TELEVISION TUNER

[75] Inventor: Vince Birleson, W. Tawakoni, Tex.

[73] Assignee: Microtune, Inc., Plano, Tex.

[21] Appl. No.: 904,906

[22] Filed: Aug. 1, 1997

[51] Int. Cl.[6] .............................. H03L 7/07; H03L 7/16; H04B 1/26; H04B 15/00

[52] U.S. Cl. .................................. 331/2; 331/16; 331/39; 331/41; 455/260; 455/316; 455/318

[58] Field of Search .................................. 331/2, 16, 22, 331/25, 38, 39, 41; 455/260, 314–318; 348/731

[56] References Cited

U.S. PATENT DOCUMENTS

| | | | |
|---|---|---|---|
| 4,512,035 | 4/1985 | Victor et al. | 455/316 X |
| 4,551,856 | 11/1985 | Victor et al. | 455/316 X |
| 5,640,697 | 6/1997 | Orndorff | 455/315 |

*Primary Examiner*—David Mis
*Attorney, Agent, or Firm*—Fulbright & Jaworski L.L.P.

[57] ABSTRACT

An interference free local oscillator circuit is disclosed. A first local oscillator signal is generated in a first phase locked loop. A second local oscillator signal is generated in a second phase locked loop. Third and fourth phase locked loops provide inputs to the second phase locked loop to control the second local oscillator frequency. The operating frequencies of the first and second local oscillator signals are selected so that spurious signals generated in the phase locked loops do not interfere with a received RF signal in a conversion circuit.

34 Claims, 5 Drawing Sheets

FIG. 4

| PC | LO1 (VCO1) | LO1/2 | LO1/4 | LO1/8 | LO1/9 | LO1/8/2 | LO1/9/2 | LO1/LO2 | IF | LO2 (VCO2) | VCO3 | VCO4 | VCO4/42 | VCO3/2 | VCO3/4 | VCO3/6 | VCO3/7 | VCO3/6/2 | VCO3/7/2 | VCO4/2 | VCO4/4 |
|---|---|---|---|---|---|---|---|---|---|---|---|---|---|---|---|---|---|---|---|---|
| 55.25 | 1145 | 572.25 | 286.1 | 143 | 127 | 71.5 | 63.6 | H/L | 1089.25 | 1043.5 | 1034.25 | 388.5 | 9.25 | 517 | 259 | 172 | 148 | 86.19 | 73.9 | 194 | 97 |
| 61.25 | 1150 | 574.88 | 287.4 | 144 | 128 | 71.9 | 63.9 | H/L | 1088.5 | 1042.8 | 1034.25 | 357 | 8.5 | 517 | 259 | 172 | 148 | 86.19 | 73.9 | 179 | 89 |
| 67.25 | 1155 | 577.5 | 288.8 | 144 | 128 | 72.2 | 64.2 | H/L | 1087.75 | 1042 | 1034.25 | 325.5 | 7.75 | 517 | 259 | 172 | 148 | 86.19 | 73.9 | 163 | 81 |
| 73.25 | 1160 | 580.13 | 290.1 | 145 | 129 | 72.5 | 64.5 | H/L | 1087 | 1041.3 | 1034.25 | 294 | 7 | 517 | 259 | 172 | 148 | 86.19 | 73.9 | 147 | 74 |
| 79.25 | 1166 | 582.75 | 291.4 | 146 | 130 | 72.8 | 64.8 | H/L | 1086.25 | 1040.5 | 1034.25 | 262.5 | 6.25 | 517 | 259 | 172 | 148 | 86.19 | 73.9 | 131 | 66 |
| 85.25 | 1171 | 585.38 | 292.7 | 146 | 130 | 73.2 | 65 | H/L | 1085.5 | 1039.8 | 1034.25 | 231 | 5.5 | 517 | 259 | 172 | 148 | 86.19 | 73.9 | 116 | 58 |
| 91.25 | 1181 | 590.63 | 295.3 | 148 | 131 | 73.8 | 65.6 | H/L | 1090 | 1044.3 | 1034.25 | 420 | 10 | 517 | 259 | 172 | 148 | 86.19 | 73.9 | 210 | 105 |
| 97.25 | 1187 | 593.25 | 296.6 | 148 | 132 | 74.2 | 65.9 | H/L | 1089.25 | 1043.5 | 1034.25 | 388.5 | 9.25 | 517 | 259 | 172 | 148 | 86.19 | 73.9 | 194 | 97 |
| 103.25 | 1192 | 595.88 | 297.9 | 149 | 132 | 74.5 | 66.2 | H/L | 1088.5 | 1042.8 | 1034.25 | 357 | 8.5 | 517 | 259 | 172 | 148 | 86.19 | 73.9 | 179 | 89 |
| 109.25 | 1197 | 598.5 | 299.3 | 150 | 133 | 74.8 | 66.5 | H/L | 1087.75 | 1042 | 1034.25 | 325.5 | 7.75 | 517 | 259 | 172 | 148 | 86.19 | 73.9 | 163 | 81 |
| 115.25 | 1202 | 601.13 | 300.6 | 150 | 134 | 75.1 | 66.8 | H/L | 1087 | 1041.3 | 1034.25 | 294 | 7 | 517 | 259 | 172 | 148 | 86.19 | 73.9 | 147 | 74 |
| 121.25 | 1208 | 603.75 | 301.9 | 151 | 134 | 75.5 | 67.1 | H/L | 1086.25 | 1040.5 | 1034.25 | 262.5 | 6.25 | 517 | 259 | 172 | 148 | 86.19 | 73.9 | 131 | 66 |
| 127.25 | 1213 | 606.38 | 303.2 | 152 | 135 | 75.8 | 67.4 | H/L | 1085.5 | 1039.8 | 1034.25 | 231 | 5.5 | 517 | 259 | 172 | 148 | 86.19 | 73.9 | 116 | 58 |
| 133.25 | 1223 | 611.63 | 305.8 | 153 | 136 | 76.5 | 68 | H/L | 1090 | 1044.3 | 1034.25 | 420 | 10 | 517 | 259 | 172 | 148 | 86.19 | 73.9 | 210 | 105 |
| 139.25 | 1229 | 614.25 | 307.1 | 154 | 137 | 76.8 | 68.3 | H/L | 1089.25 | 1043.5 | 1034.25 | 388.5 | 9.25 | 517 | 259 | 172 | 148 | 86.19 | 73.9 | 194 | 97 |
| 145.25 | 1234 | 616.88 | 308.4 | 154 | 137 | 77.1 | 68.5 | H/L | 1088.5 | 1042.8 | 1034.25 | 357 | 8.5 | 517 | 259 | 172 | 148 | 86.19 | 73.9 | 179 | 89 |
| 151.25 | 1239 | 619.5 | 309.8 | 155 | 138 | 77.4 | 68.8 | H/L | 1087.75 | 1042 | 1034.25 | 325.5 | 7.75 | 517 | 259 | 172 | 148 | 86.19 | 73.9 | 163 | 81 |
| 157.25 | 1244 | 622.13 | 311.1 | 156 | 138 | 77.8 | 69.1 | H/L | 1087 | 1041.3 | 1034.25 | 294 | 7 | 517 | 259 | 172 | 148 | 86.19 | 73.9 | 147 | 74 |
| 163.25 | 1250 | 624.75 | 312.4 | 156 | 139 | 78.1 | 69.4 | H/L | 1086.25 | 1040.5 | 1034.25 | 262.5 | 6.25 | 517 | 259 | 172 | 148 | 86.19 | 73.9 | 131 | 66 |
| 169.25 | 1255 | 627.38 | 313.7 | 157 | 139 | 78.4 | 69.7 | H/L | 1085.5 | 1039.8 | 1034.25 | 231 | 5.5 | 517 | 259 | 172 | 148 | 86.19 | 73.9 | 116 | 58 |
| 175.25 | 1265 | 632.63 | 316.3 | 158 | 141 | 79.1 | 70.3 | H/L | 1090 | 1044.3 | 1034.25 | 420 | 10 | 517 | 259 | 172 | 148 | 86.19 | 73.9 | 210 | 105 |
| 181.25 | 1271 | 635.25 | 317.6 | 159 | 141 | 79.4 | 70.6 | H/L | 1089.25 | 1043.5 | 1034.25 | 388.5 | 9.25 | 517 | 259 | 172 | 148 | 86.19 | 73.9 | 194 | 97 |

FIG. 5

| PC | LO1 (VCO1) | LO1/2 | LO1/4 | LO1/8 | LO1/9 | LO1/8/2 | LO1/9/2 | LO1/LO2 | IF | LO2 (VCO2) | VCO3 | VCO4 | VCO4/42 | VCO3/2 | VCO3/4 | VCO3/6 | VCO3/7 | VCO3/6/2 | VCO3/7/2 | VCO4/2 | VCO4/4 |
|---|---|---|---|---|---|---|---|---|---|---|---|---|---|---|---|---|---|---|---|---|---|
| 55.25 | 1145 | 572.25 | 286.1 | 143 | 127 | 71.5 | 63.6 | H/L | 1089.25 | 1043.5 | 1034.25 | 388.5 | 9.25 | 517 | 259 | 172 | 148 | 86.19 | 73.9 | 194 | 97 |
| 61.25 | 1150 | 574.88 | 287.4 | 144 | 128 | 71.9 | 63.9 | H/L | 1088.5 | 1042.8 | 1034.25 | 357 | 8.5 | 517 | 259 | 172 | 148 | 86.19 | 73.9 | 179 | 89 |
| 67.25 | 1024 | 511.88 | 255.9 | 128 | 114 | 64 | 56.9 | L/H | 1091 | 1136.8 | 1128.75 | 336 | 8 | 564 | 282 | 188 | 161 | 94.06 | 80.6 | 168 | 84 |
| 73.25 | 1019 | 509.25 | 254.6 | 127 | 113 | (63.7) | 56.6 | L/H | 1091.75 | 1137.5 | 1128.75 | 367.5 | 8.75 | 564 | 282 | 188 | 161 | 94.06 | (80.6) | 184 | (92) |
| 79.25 | 1166 | 582.75 | 291.4 | 146 | 130 | 72.8 | 64.8 | H/L | 1086.25 | 1040.5 | 1034.25 | 262.5 | 6.25 | 517 | 259 | 172 | 148 | 86.19 | 73.9 | 131 | 66 |
| 85.25 | 1008 | 504 | 252 | 126 | 112 | 63 | 56 | L/H | 1093.25 | 1139 | 1128.75 | 430.5 | 10.3 | 564 | 282 | 188 | 161 | 94.06 | 80.6 | 215 | 108 |
| 91.25 | 1181 | 590.63 | 295.3 | 148 | 131 | 73.8 | 65.6 | H/L | 1090 | 1044.3 | 1034.25 | 420 | 10 | 517 | 259 | 172 | 148 | 86.19 | 73.9 | 210 | 105 |
| 97.25 | 992 | 496.13 | 248.1 | 124 | 110 | 62 | 55.1 | L/H | 1089.5 | 1135.3 | 1128.75 | 273 | 6.5 | 564 | 282 | 188 | 161 | 94.06 | 80.6 | 137 | 68 |
| 103.25 | 1192 | 595.88 | 297.9 | 149 | 132 | 74.5 | 66.2 | H/L | 1088.5 | 1042.8 | 1034.25 | 357 | 8.5 | 517 | 259 | 172 | 148 | 86.19 | 73.9 | 179 | 89 |
| 109.25 | 1197 | 598.5 | 299.3 | 150 | 133 | 74.8 | 66.5 | H/L | 1087.75 | 1042 | 1034.25 | 325.5 | 7.75 | 517 | 259 | 172 | 148 | 86.19 | 73.9 | 163 | 81 |
| 115.25 | 1202 | 601.13 | 300.6 | 150 | 134 | 75.1 | 66.8 | L/H | 1087 | 1041.3 | 1034.25 | 294 | 7 | 517 | 259 | 188 | 148 | 86.19 | 73.9 | 147 | 74 |
| 121.25 | 1208 | 603.75 | 301.9 | 151 | 134 | 75.5 | 67.1 | H/L | 1086.25 | 1040.5 | 1034.25 | 262.5 | 6.25 | 517 | 259 | 172 | 148 | 86.19 | 73.9 | 131 | 66 |
| 127.25 | 1213 | 606.38 | 303.2 | 152 | 135 | 75.8 | 67.4 | H/L | 1085.5 | 1039.8 | 1034.25 | 231 | 5.5 | 517 | 259 | 172 | 148 | 86.19 | 73.9 | 116 | 58 |
| 133.25 | 1223 | 611.63 | 305.8 | 153 | 136 | 76.5 | 68 | L/H | 1090 | 1044.3 | 1034.25 | 420 | 10 | 564 | 259 | 172 | 148 | 86.19 | 73.9 | 210 | 105 |
| 139.25 | 1229 | 614.25 | 307.1 | 154 | 137 | 76.8 | 68.3 | H/L | 1089.25 | 1043.5 | 1034.25 | 388.5 | 9.25 | 517 | 259 | 172 | 148 | 86.19 | 73.9 | 194 | 97 |
| 145.25 | 945 | 472.5 | 236.3 | 118 | 105 | 59.1 | 52.5 | L/H | 1090.25 | 1136 | 1128.75 | 304.5 | 7.25 | 564 | 282 | 188 | 161 | 94.06 | 80.6 | 152 | 76 |
| 151.25 | 940 | 469.88 | 234.9 | 117 | 104 | 58.7 | 52.2 | L/H | 1091 | 1136.8 | 1128.75 | 336 | 8 | 564 | 282 | 188 | 161 | 94.06 | 80.6 | 168 | 84 |
| 157.25 | 1244 | 622.13 | 311.1 | 156 | 138 | 77.8 | 69.1 | H/L | 1087 | 1041.3 | 1034.25 | 294 | 7 | 517 | 259 | 172 | 148 | 86.19 | 73.9 | 147 | 74 |
| 163.25 | 1250 | 624.75 | 312.4 | 156 | 139 | 78.1 | 69.4 | H/L | 1086.25 | 1040.5 | 1034.25 | 262.5 | 6.25 | 517 | 259 | 172 | 148 | 86.19 | 73.9 | 131 | 66 |
| 169.25 | 924 | 462 | 231 | 116 | 103 | 57.8 | 51.3 | L/H | 1093.25 | 1139 | 1128.75 | 430.5 | 10.3 | 564 | 282 | 188 | 161 | 94.06 | 80.6 | 215 | 108 |
| 175.25 | 1265 | 632.63 | 316.3 | 158 | 141 | 79.1 | 70.3 | H/L | 1090 | 1044.3 | 1034.25 | 420 | 10 | 517 | 259 | 172 | 148 | 86.19 | 73.9 | 210 | 105 |
| 181.25 | 908 | 454.13 | 227.1 | 114 | 101 | 56.8 | 50.5 | L/H | 1089.5 | 1135.3 | 1128.75 | 273 | 6.5 | 564 | 282 | 188 | 161 | 94.06 | 80.6 | 137 | 68 |

INTERFERENCE-FREE BROADBAND TELEVISION TUNER

RELATED APPLICATIONS

This application is related to co-pending application entitled DUAL MODE TUNER FOR CO-EXISTING DIGITAL AND ANALOG TELEVISION SIGNALS, assigned Ser. No. 08/904,693, co-pending application entitled BROADBAND INTEGRATED TELEVISION TUNER, assigned Ser. No. 08/904,908, and co-pending application entitled BROADBAND FREQUENCY SYNTHESIZER, assigned Ser. No. 08/904,907, all of which are filed concurrently herewith and assigned to a common assignee, which applications are hereby incorporated by reference herein.

TECHNICAL FIELD OF THE INVENTION

This invention relates to local oscillators and more particularly to local oscillators that drive conversion circuits in such a way as to reduce interference from spurious signals.

BACKGROUND OF THE INVENTION

It is well known in the art to use local oscillators (LOs) to drive dual conversion circuits. In such circuits, a first LO signal is mixed with an RF signal in a first mixer to generate a first intermediate frequency (IF) signal. Then, the first IF signal is mixed with a second LO signal in a second mixer to generate a second IF signal. The frequencies of the first and second LO signals are usually selected so that the first and second IF signals occur either at a specific frequency or within a specified frequency range.

The LOs may generate spurious signals at harmonic and subharmonic frequencies of the desired signal. One problem in the prior art occurs when these spurious signals feed back into the RF input or couple to some other part of the conversion circuit. Signal coupling is likely to occur when the local oscillators and the conversion circuit are constructed on an integrated circuit substrate. One method of eliminating the effects of spurious signals is to use band pass filters which attenuate the spurious frequencies in the IF signals. A problem with this method arises when the spurious signals are close in frequency to the incoming RF signal or to the selected IF signals.

When a dual mixer conversion circuit is used in a television tuner, additional problems arise because there are more than one frequency associated with each television channel. For example, in the United States, the television system is based upon a signal that comprises a picture carrier at the signal frequency, a chroma carrier that is 3.6 MHz above the picture carrier frequency and a audio carrier that is 4.5 MHz above the picture carrier. As a result, spurious signals may interfere with any of these carrier frequencies.

A television tuner that is constructed on a integrated circuit substrate is disclosed in the pending patent application entitled MONOLITHIC TELEVISION TUNER, filed Apr. 21, 1995 and assigned Ser. No. 08/426,080. However, that application does not disclose the present system and method for an interference free broadband tuner circuit.

SUMMARY OF THE INVENTION

For an RF signal, such as television signal, which has a predetermined shape, a conversion circuit can be controlled so that the shape of the output signal is proportionate to the shape of the input signal. Also, the output signal shape may have the same orientation as the RF signal shape or it may be a mirror-image of the RF signal shape. A conversion circuit is controlled by the local oscillator (LO) frequencies that are applied to the circuit's mixers. If the LO frequencies are selected to be lower than the desired intermediate frequency (IF) signal, then the resulting IF signal will have the same shape as the RF signal. On the other hand, if the LO frequencies are selected to be higher than the desired IF signal, then the mixer output will be an IF signal with a shape that is a mirror-image of the RF signal. When two or more mixers are used in a conversion circuit, various combinations of the LO frequencies can be used to generate IF signals having a desired shape.

Spurious signals having harmonic and subharmonic frequencies are generated in local oscillator circuits and in conversion circuits. If the frequency of these signals are near the frequency of the desired RF signal, then interference will result. The present invention provides for monitoring local oscillator signals and the associated spurious signal frequencies in a conversion circuit. If the spurious signals frequencies are near the RF signal frequency, then the present invention provides for adjusting the local oscillator frequencies in such a way as to maintain a desired IF signal shape while minimizing interference signals at the same time.

It is a technical advantage of the present invention to provide a system and method for adjusting the local oscillator frequencies of a conversion circuit in such a manner as to maintain a desired IF signal shape.

It is a further technical advantage of the present invention to provide a system and method for calculating the frequencies of spurious signals in a conversion circuit.

It is another technical advantage of the present invention to provide a system and method for adjusting the local oscillator frequencies of a conversion circuit to minimize interference from spurious local oscillator frequencies.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 is a table showing the frequency of selected signals as they pass through a dual mixer conversion circuit using the local oscillator of the present invention; and FIG. 5 is a table showing alternative frequencies of selected signals passing through a dual mixer conversion circuit using the local oscillator of the present invention.

DESCRIPTION OF THE PREFERRED EMBODIMENTS

These and other objects, features and technical advantages are achieved by a system and method in which multiple phase locked loop (PLL) circuits are used to drive voltage controlled oscillators (VCOs) in order to generate the LO signals for a dual mixer conversion circuit.

Figure 1:
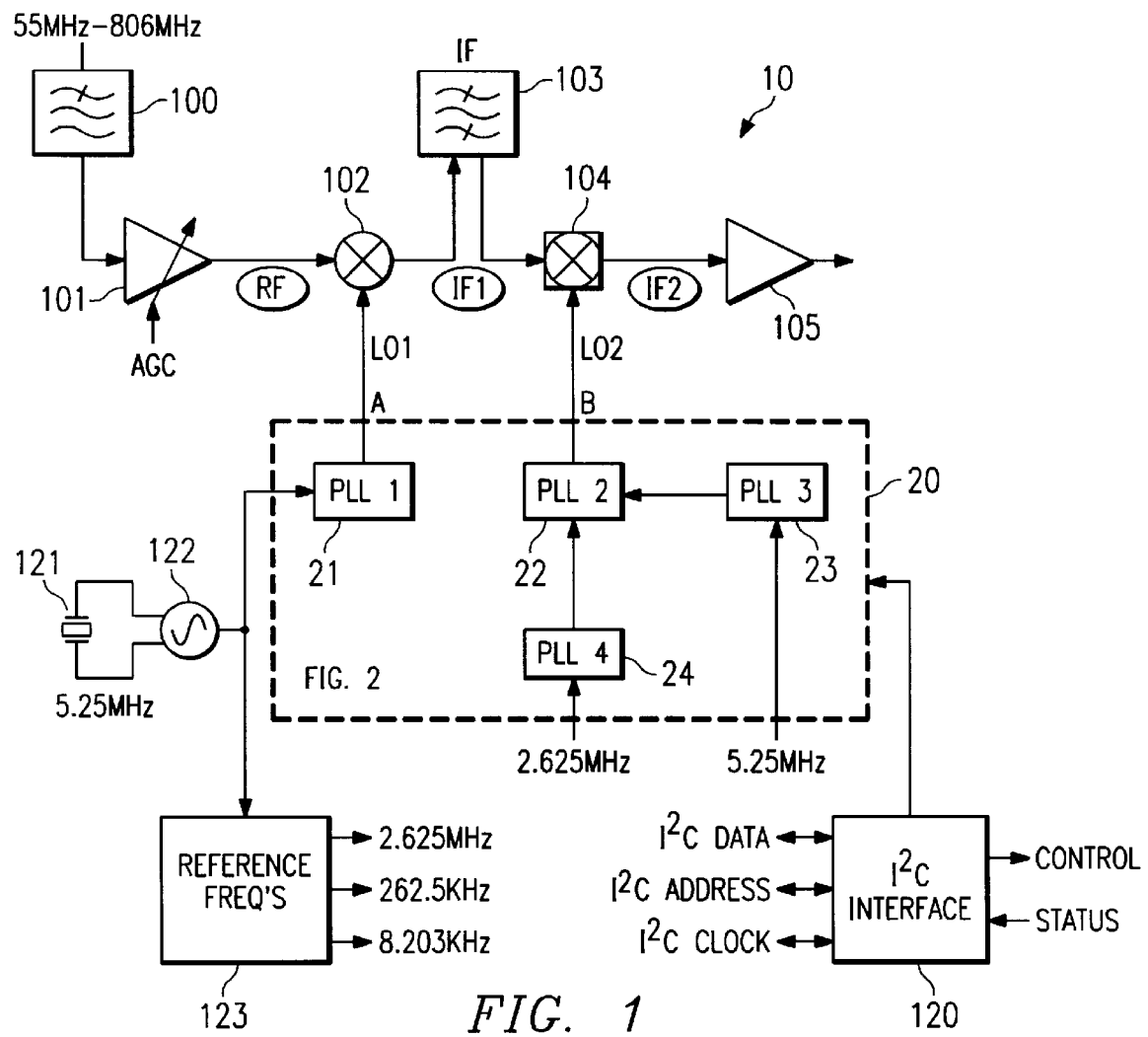
FIG. 1 is a high-level block diagram of a conversion circuit for a television tuner using the local oscillator of the present invention.

FIG. 1 shows conversion circuit 10 having dual mixers 102 and 104 which receive LO signals LO1 and LO2 on lines A and B from local oscillator circuit 20. In the preferred embodiment, conversion circuit 10 is used in a television tuner circuit as described in the above mentioned co-pending application entitled DUAL MODE TUNER FOR CO-EXISTING DIGITAL AND ANALOG TELEVISION SIGNALS.

In a television system, signals representing individual channels are assigned to specific frequencies in a defined frequency band. For example, in the United States, television signals are generally transmitted in a band from 55 MHz to 806 MHz. The received RF signals pass through a front-end filter 100. In the prior art, filter 100 usually was a bandpass tracking filter that allowed only a narrow range of frequencies to pass. In the preferred embodiment, filter 100 is a low pass filter that is designed to remove all frequencies above an input cutoff frequency. The input cutoff frequency is chosen to be higher than the frequencies of the channels in the television band. The output of filter 100 then passes through amplifier 101 to adjust the signal level that is provided to mixer 102. When conversion circuit 10 is used in a receiver circuit, amplifier 101 may be an automatic gain control (AGC) amplifier that is adjusted to maintain an overall receiver gain. Following amplifier 101, the RF signal is provided to mixer 102 where it is mixed with a local oscillator signal LO1 from local oscillator circuit 20. The output of mixer 102 is first intermediate frequency signal IF1. Typically, the frequency of LO1 is variable and will be selected based upon the channel in the RF signal that is being tuned. LO1 is selected so that the mixing of LO1 and RF in mixer 102 generates an IF1 signal either at a specified frequency or within a narrow range of frequencies.

Following mixer 102, IF filter 103 is a band pass filter that is used to remove unwanted frequencies and spurious signals from the IF1 signal. The band of frequencies that are passed by filter 103 is a matter of design choice depending upon the IF1 frequency selected in each particular conversion circuit. In the preferred embodiment, IF filter 103 is centered at 1090 MHz and has a 14 MHz pass band. This allows the selected IF1 frequency to vary within 1083–1097 MHz. Mixer 104 receives both the filtered IF1 signal from filter 103 and a second local oscillator signal (LO2) from oscillator circuit 20. These signals are mixed to generate a second intermediate frequency (IF2) at the output of mixer 104. In the preferred embodiment, mixer 104 is an image rejection mixer that rejects image frequencies from the IF2 signal. LO2 may be a variable or fixed frequency depending upon whether IF1 is at a fixed frequency or if it varies over a range of frequencies. In either case, the frequency of LO2 is selected to generate a fixed frequency IF2 signal. The IF2 signal is provided through amplifier/buffer 105 to additional processing circuitry (not shown) to generate either digital or analog television signals. In the preferred embodiment, the frequency of IF2 is selected to be 45.75 MHz.

Figure 3A:
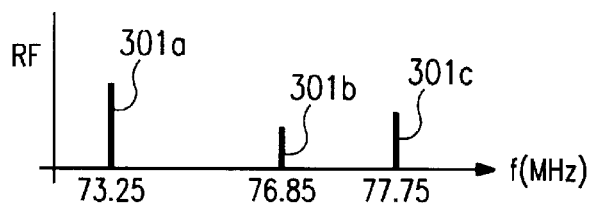
FIG. 3A shows the relationship of the picture carrier, chroma carrier and audio carrier of a typical RF television signal.
Figure 3B:
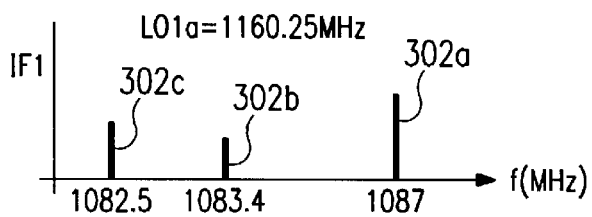
FIG. 3B shows the carrier signals of FIG. 3A converted to an IF signal.
Figure 3C:
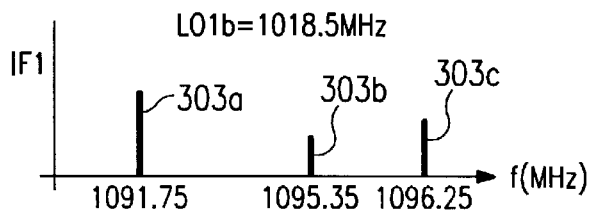
FIG. 3C shows the carrier signals of FIG. 3A converted to an IF signal.
Figure 3D:
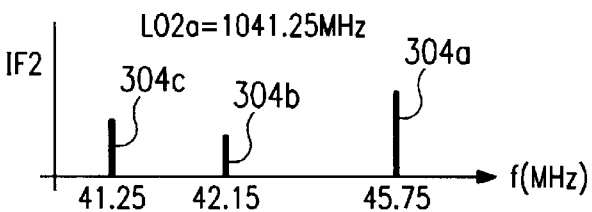
FIG. 3D shows the carrier signals of FIG. 3B converted to a second IF signal.
Figure 3E:
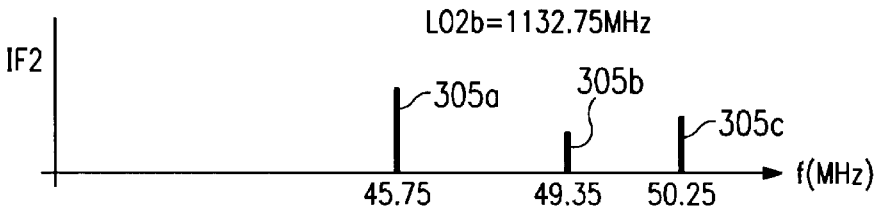
FIG. 3E shows the carrier signals of FIG. 3B converted to a second IF signal.
Figure 3F:
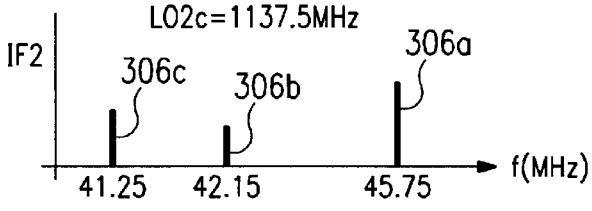
FIG. 3F shows the carrier signals of FIG. 3C converted to a second IF signal.
Figure 3G:
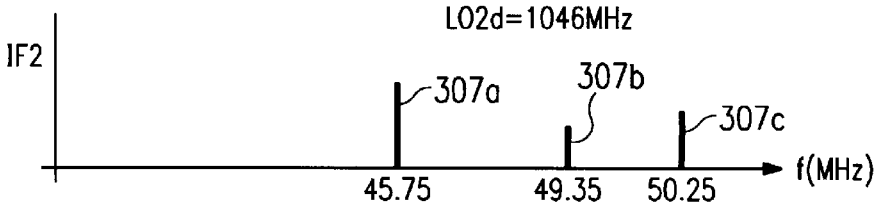
FIG. 3G shows the carrier signals of FIG. 3C converted to a second IF signal.

An additional consideration when using a dual mixer conversion circuit in a television receiver is the relationship of the picture, chroma and audio carriers in an analog television signal. FIG. 3A illustrates the relationship of these carrier signals for a 73.25 MHz signal. FIGS. 3B and 3C show the carrier signals after the 73.25 MHz RF signal of FIG. 3A has been converted to a first IF signal using different LO signals. FIGS. 3D and 3E show the carrier signals after the first IF signal of FIG. 3B is converted to a second IF signal at 45.75 MHz using different LO signals. FIGS. 3F and 3G show the carrier signals after the first IF signal of FIG. 3C is converted to a second IF signal at 45.75 MHz using different LO signals. RF picture carrier 301a is at 73.25 MHz, chroma carrier 301b is 3.6 MHz higher at 76.85 MHz and audio carrier 301c is 4.5 MHz above the picture carrier at 77.75 MHz. Signals 302a–c and 303a–c illustrate the result of mixing RF signal 301a–c with LO1 to obtain an IF1 frequency within the 1090 MHz±7 MHz pass band of filter 103.

IF1 301a–c results from mixing RF 301a–c with LO1a at 1160.25 MHz. As a result of this mixing, the relationship between the picture, chroma and audio carriers has been inverted. Picture carrier 301a has been translated to an IF1 picture carrier 302a at 1087 MHz. However, the audio carrier 302a and chroma carrier 302c have been shifted to lower frequencies. IF1 302a–c can be further mixed with LO2 to generate an IF2 signal with the picture carrier at the desired frequency of 45.75 MHz. Using LO2a at 1041.25 MHz, the carriers in IF2 304a–c will maintain an inverse relationship to the RF signal 301a–c. Picture carrier 304a is at 45.75 MHz as desired and audio carrier 304c and chroma carrier 304b are at lower frequencies. On the other hand, if LO2b at 1132.75 MHz is used, then IF2 305a–c will have the same relationship as the carriers in RF 301a–c. Chroma carrier 305b is 3.6 MHz above picture carrier 305a and audio carrier 305b is 4.5 MHz above picture carrier 305a.

Another group of local oscillator frequencies can be used to obtain the same results. IF1 303a–c is generated by mixing RF 301a–c with LO1b at 1018 MHz. IF1 303a–c maintains the same carrier relationship as RF 301a–c. An IF2 signal with the picture carrier at 45.75 can be generated from IF1 303 by mixing it with LO2c at 1137.5 MHz or LO2d at 1046 MHz, as shown by IF2 306a–c and 307a–c. The carriers in IF2 306a–c have an inverted relationship to the carriers in RF 301a–c and the carriers in IF2 307a–c have the same relationship as RF 301a–c.

For analog television signals, it is desirable to choose a combination of LO1 and LO2 so that the relationship between the picture, chroma and audio carriers is always the same in the IF2 signal. When the IF2 signal is further processed after amplifier 105, it may be a consideration that the analog processing circuits are able to find the chroma and audio carriers in the same place, either above or below the picture carrier, for every channel. In the preferred embodiment, LO1 and LO2 are selected so that the IF2 shape is the inverse of the RF shape. That is, the picture carrier is converted from an RF signal of 55–806 MHz to an IF2 signal at 45.75 MHz with the audio carrier 4.5 MHz below the picture carrier and the chroma carrier 3.6 MHz below the picture carrier.

As shown in FIGS. 3D and 3E, the audio and chroma carriers in IF2 signals 304a–c and 306a–c are below the picture carrier frequency. This is accomplished by using the lower LO2 frequency (1041 MHz) with the higher LO1 frequency (1160.25 MHz) or using the higher LO2 frequency (1137.5 MHz) with the lower LO1 frequency (1018.5 MHz).

LO1 is generated in local oscillator circuit 20 by PLL1 21 and LO2 is generated by PLL2 22. PLL3 23 and PLL4 24 provide reference inputs to PLL2 22. I²C 120 controls local oscillator circuit 20 and causes PLL1–4 21–24 to select the correct LO1 and LO2 frequencies. Local oscillator circuit 20 receives reference signals from oscillator 122 and reference frequency generator 123. Oscillator 122 provides a 5.25 MHz output based on crystal 121. Frequency generator 123 divides the 5.25 MHz signal from oscillator 122 to generate additional reference signals at other frequencies.

Figure 2:
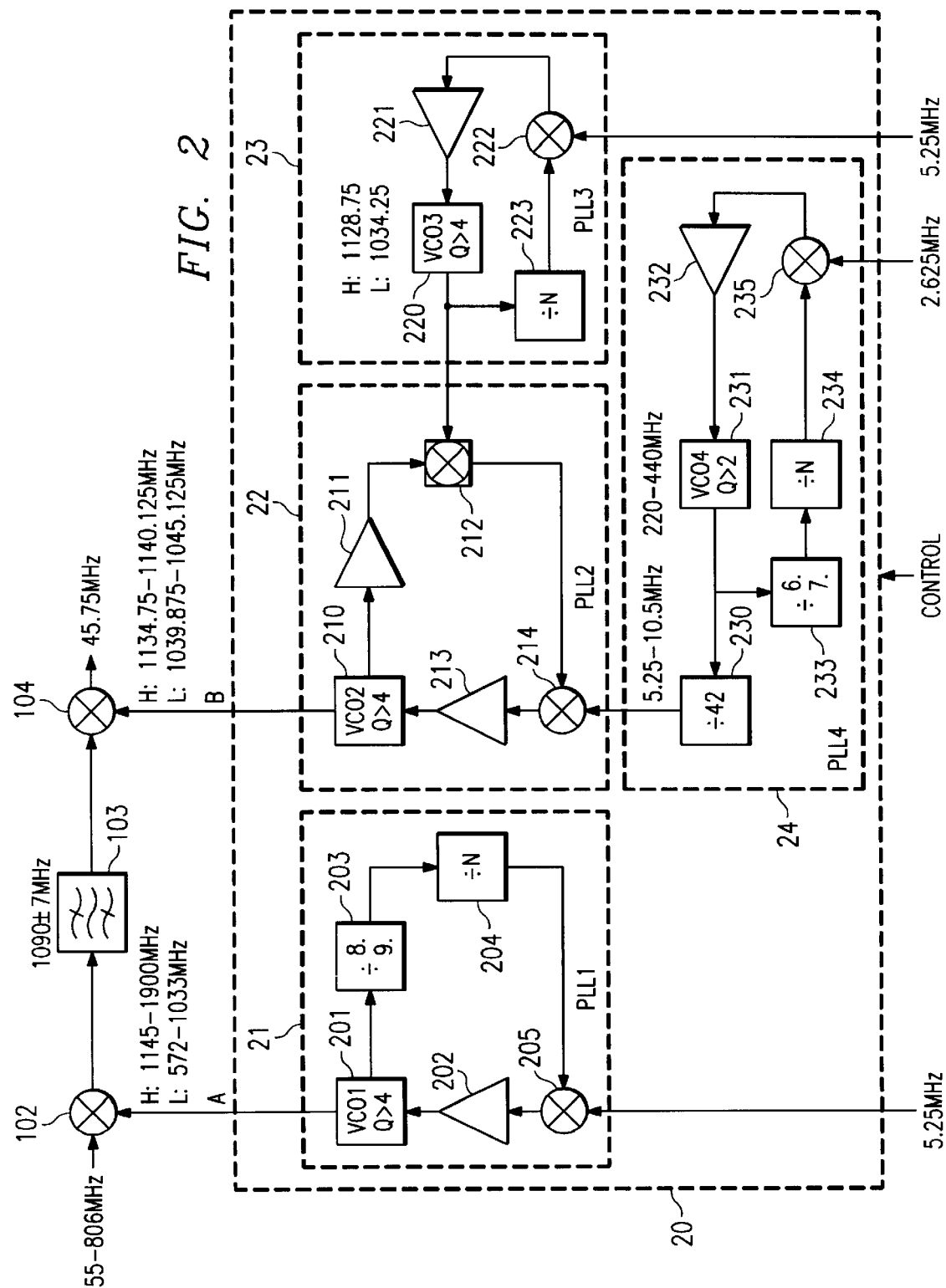
FIG. 2 is a block diagram of the local oscillator circuit of the present invention.

Local oscillator circuit 20 and PLL1–4 21–24 are shown in greater detail in FIG. 2. PLL1 21 provides the first local oscillator signal (LO1) to mixer 102. PLL2 22, PLL3 23 and PLL4 24 cooperate to provide the second local oscillator signal (LO2) to mixer 104. PLL1 21 receives a 5.25 MHz reference signal at phase comparator 205. The output of phase comparator 205 feeds loop amplifier 202 which, in turn, provides the input for VCO1 201. There are two outputs from VCO1 201. One output provides the LO1 signal to mixer 102 over line A. The other output goes into a divider network comprised of ÷8/÷9 circuit 203 and ÷N circuit 204. Divider circuits 203 and 204 divide the output of VCO1 201 down to a signal having a frequency of 5.25 MHz. This divided-down signal is compared with the 5.25 MHz reference signal in phase comparator 205 to complete the phase locked loop.

The output of VCO1 21 is variable between 1145–1900 MHz on the high side and 572–1033 MHz on the low side. Frequencies below 572 MHz are not used in LO1 to minimize the introduction of interference frequencies into the conversion circuit. LO1 is chosen from within these ranges so that IF1 signal is within the 1090 MHz±7 MHz pass band of filter 103. The 5.25 MHz reference signal creates an output stepsize of 5.25 MHz in LO1 which is utilized for course tuning in conversion circuit 10. In the preferred embodiment, PLL1 21 has a bandwidth on the order of 500 KHz. A wide bandwidth is preferable to get good close-in phase noise characteristics.

Fine tuning is accomplished by LO2 which is produced by the operation of 3 phase lock loops PLL2 22, PLL3 23 and PLL4 24. PLL4 24 has the same basic configuration as PLL1 21. It has reference signal of 2.625 MHz which is input to phase comparator 235. The output of phase comparator 235 drives loop amplifier 232 which in turn drives VCO4 231. The output of VCO4 231 has frequency range of 220–440 MHz with a 2.625 MHz stepsize and is provided to two divider circuits. One output of VCO4 231 goes to a divider network comprised of ÷6/÷7 circuit 233 and ÷N circuit 234. The effect of divider network 233 and 234 is to divide the output signal of VCO4 230 back down to 2.625 MHz. This signal is then compared with the 2.625 MHz reference signal in phase comparator 235 to complete the phase locked loop. The other output of VCO4 231 is provided to ÷42 circuit 230. The output of divider 230 is a signal with a frequency range of 5.25–10.5 MHz and having a 62.5 KHz stepsize. The output of divider 230 serves as a reference signal for PLL2 22.

In PLL3 23, a 5.25 MHz reference signal is input to phase detector 222. Phase detector 222 drives loop amplifier 221 which in turn drives VCO3 220. The output of VCO3 23 is divided back down to 5.25 MHz by ÷N circuit 223 and then fed back into phase detector 222 to complete the loop. The output of VCO3 23 is selectable between 1128.75 MHz and 1034.25 MHz. The selection between these two frequencies determines whether LO2 is on the high side or the low side.

In PLL2 22, the signal from PLL4 24 is received by phase comparator 214 which in turn drives loop amplifier 213. The output of loop amplifier 213 controls VCO2 210. VCO2 210 provides the LO2 signal for mixer 104 over line B. The LO2 signal varies between 1134.75–1140.125 MHz on the high side and 1039.875–1045.125 MHz on the low side. Another output from VCO2 210 passes through buffer amplifier 211 and then drives image reject mixer 212. Mixer 212 receives its other input from PLL3 23. Since the signal from PPL3 23 is near the frequency of the LO2 signal in VCO2 210, it is important that the reverse isolation between mixer 212 and VCO2 210 is good to prevent the PLL3 23 signal from passing into the LO2 output of VCO2 210. The output of mixer 212 is provided to phase comparator 214 to complete the loop in PLL2 22.

In the preferred embodiment, the loop bandwidths of PLL2 22, PLL3 23 and PLL4 24 are all wide to provide good overall close-in phase noise. PLL2 22 and PLL3 23 have bandwidths of approximately 300–500 KHz. The bandwidth of PLL4 24 is approximately 200–300 KHz. These bandwidths give phase noise at 100 KHz that is satisfactory for digital television.

FIGS. 4 and 5 are tables showing the harmonic and spurious signal frequencies that occur in conversion circuit 10 for certain LO1 and LO2 signals. In FIG. 4, column 401 represents potential picture carrier frequencies in the RF signal. Column 402 shows the associated LO1 frequency that is required to generate an IF1 signal within the pass band of filter 103. The resulting IF1 frequencies are shown in column 403. Column 404 shows the frequencies of the various LO2 signals that are required to convert each IF1 to a 45.75 MHz IF2 signal.

Columns 405 represent spurious signals that can be generated in PLL1 21 for each LO1 frequency. As indicated by the column headings, the spurious signals can occur at frequencies that are one-half, one-quarter, etc. of the LO1 frequency. Columns 406 represent similar spurious signals generated in PLL2–4 22–24 for each LO2 frequency. Some of these spurious signals are caused by the divider circuits in the phase locked loops. Interference problems can arise in television tuner circuits if harmonic or spurious signals are within −1 MHz to +5 MHz of the picture carrier frequency 401.

The frequencies in FIG. 4 represent the situation where LO1 is on the high side and LO2 is on the low side as indicated by column 407. In row 41, the picture carrier frequency of 73.25 is shown along with the associated LO, IF and spurious signal frequencies. It can be seen from the table that a spurious signal at 72.5 MHz is generated in PLL1 21 as a subharmonic of the VCO1 210 frequency. Also, a 73.9 MHz spurious signal is generated in PLL3 23 from VCO3 220 and a 74 MHz spurious signal is generated in PLL4 24 from VCO4 231.

In FIG. 5, the same picture carrier frequencies are shown, however, for certain frequencies the LO1/LO2 combination has been switched so that LO1 is on the low side and LO2 is on the high side as indicated in column 501. The benefits of switching the LO1 and LO2 frequencies are shown in line 51 for the 73.25 MHz picture carrier. Now the spurious signals that fell within −1 MHz to +5 MHz of the picture carrier are gone and the closest signal is at 80.625 MHz which is more than 5 MHz higher than the picture carrier frequency.

Although a television tuner circuit has been used to describe the advantages of the present invention, the same principles can be applied to prevent interference in other conversion circuits that operate in other frequency bands. I$^2$C 120 can be controlled by a processor, such as a computer, so that it is capable of monitoring the RF and local oscillator frequencies, determining potential spurious signal frequencies and adjusting the local oscillator frequencies as appropriate to reduce interference and to maintain the desired output signal shape.

It will be understood that the present invention can be embodied to operate with either digital or analog signals in any frequency range. Generally, the orientation of the second IF signal will only be a consideration for analog television signals. It will be further noted the I$^2$C protocol need not be used but this circuit will work with any digital interface. FIG. 3A illustrates a typical analog television signal having three distinct carrier frequencies 301*a*–*c*. Analog RF television signal 301*a*–*c* is converted to a second IF signal, such as signal 304*a*–*c* of FIG. 3D. The second IF signal is then further processed by the video and audio sections of a receiver. Typically, the second IF signal will pass through a filter with an asymmetrical pass band that is designed specifically for analog television signals. Such a filter is disclosed in the above mentioned pending patent application entitled DUAL MODE TUNER FOR CO-EXISTING DIGITAL AND ANALOG TELEVISION SIGNALS.

When a second IF signal comprising analog television carriers passes through an asymmetric filter, it is critical that the carriers are positioned properly in the filter pass band. In a typical analog television receiver, a second IF signal filter will be designed to provide different levels of attenuation for the picture carrier and the audio carrier. If the carriers are reversed when the second IF signal passes through the filter, then the signal will not be filtered correctly. This has the effect of limiting the choice of LO frequencies to those that produce the correct second IF signal shape. The first and second LO signals usually will have to be correlated so that one is in a high band and one is in a low band.

On the other hand, a digital television signal is likely to have a flat, symmetrical shape. In this case, a second IF signal filter will also have a flat and symmetrical pass band. Therefore, the orientation of the second IF signal will not be a critical factor when it passes through a second IF signal filter. Accordingly, as long as the second IF signal is at the proper frequency, its shape will not be dependent upon a specific filter characteristic. This will allow a broader range of first and second LO frequencies to be used. In the case of a digital television signal, the first and second LO signals will not have to be correlated between low/high and high/low frequency bands.

In a more broad application, beyond strict television signal receivers, anytime a receiver symmetrically filters the second IF signal, then all combinations of the first and second LO frequencies may be used. A control circuit that monitors the LO frequencies, such as I$^2$C control 120, can also provide a signal to the audio and video processing circuits of the receiver to indicate the actual shape or orientation of the second IF signal so that the signal is processed correctly. Additionally, this would apply to receivers having a single mixer conversion circuit and symmetrical filtering. If there is a potential for interference from one LO frequency choice, then the system could switch to the another LO frequency and still generate the same IF signal frequency.

The present invention will be understood to operate with conversion circuits having any number of mixers and LO signals. Software interfacing through I$^2$C 120 directs the local oscillators to switch operating frequencies if there is a potential for interference. Unless there is a requirement to maintain a specific IF signal orientation or shape, the combination of the various local oscillator frequencies will be limited only by the IF signal frequencies to be generated by the conversion circuit.

Although the present invention and its advantages have been described in detail, it should be understood that various changes, substitutions and alterations can be made herein without departing from the spirit and scope of the invention as defined by the appended claims.

What is claimed is:

1. A method for converting Radio Frequency (RF) signals to Intermediate Frequency (IF) signals using a first local oscillator signal having a first frequency and a second local oscillator signal having a second frequency, wherein a group of said RF signals having a first shape is converted to output signals having a second shape, said method comprising the steps of:

identifying one or more pairs of said first and said second frequencies, wherein said pairs of frequencies are useable for converting said group of RF signals to a desired output signal frequency band;

selecting one of said pairs of frequencies, wherein said selected pair of frequencies is selected to avoid spurious signals that may cause interference in a conversion circuit and to generate output signals having a desired shape; and converting said group of RF signals to said output signals using said selected pair of frequencies.

2. The method of claim 1 wherein said desired shape of said output signals is the same as said first shape.

3. The method of claim 1 wherein said desired shape of said output signals corresponds to an inverted first shape.

4. The method of claim 1 wherein said first frequency is within either a first low band or a first high band; and wherein said second frequency is within either a second low band or a second high band.

5. The method of claim 4 wherein when said first frequency operates in said first low band then said second frequency operates in said second high band; and when said first frequency operates in said first high band then said second frequency operates in said second low band.

6. The method of claim 1 wherein said first local oscillator signal is generated in a first phase locked loop and said second local oscillator signal is generated in a second phase locked loop; and wherein said spurious signals are generated in either said first phase locked loop or said second phase locked loop.

7. The method of claim 6 wherein said second phase locked loop is comprised of three interrelated phase locked loops.

8. A local oscillator circuit for a conversion circuit that converts Radio Frequency (RF) signals to Intermediate Frequency (IF) signals comprising:

a first phase locked loop generating a first local oscillator signal having a first frequency;

a second phase locked loop generating a second local oscillator signal having a second frequency; and means for selecting a pair of said first and said second frequencies to be used for converting said RF signals to said IF signals, wherein said pair of frequencies are selected so that spurious signals generated in said local oscillator circuit will not cause interference in said conversion circuit and so that two or more individual IF signals have a desired frequency relationship.

9. The circuit of claim 8 wherein said second phase locked loop accepts signals from a third phase locked loop and from a fourth phase locked loop; and wherein said controller selects said first frequency and said second frequency to minimize interference caused by spurious signals generated either in said third phase locked loop or in said fourth phase locked loop.

10. The circuit of claim 9 wherein each of said phase locked loops comprises a voltage controlled oscillator; and wherein frequencies of said spurious signals correspond to harmonics and subharmonics of operating frequencies of said voltage controlled oscillators.

11. The circuit of claim 8 wherein said controller selects said pair of frequencies so that said desired frequency relationship of said two or more individual IF signals corresponds to a frequency relationship of two or more RF signals.

12. The circuit of claim 8 wherein said controller selects said pair of frequencies so that said desired frequency relationship of said two or more individual IF signals is an inverse of a frequency relationship of two or more RF signals.

13. The circuit of claim 8 wherein a television channel in said RF signals has an RF picture carrier at a first carrier frequency and an RF audio carrier at a second carrier frequency, wherein said second carrier frequency is at a higher frequency than said first carrier frequency; and wherein a corresponding television channel in said IF signals has an IF picture carrier at a first IF carrier frequency and an IF audio carrier at a second IF carrier frequency, wherein said second IF carrier frequency is at a lower frequency than said first IF carrier frequency.

14. The circuit of claim 8 wherein said first frequency is within either a first low band or a first high band; and wherein said second frequency is within either a second low band or a second high band.

15. The circuit of claim 14 wherein when said first frequency operates in said first low band then said second frequency operates in said second high band; and when said first frequency operates in said first high band then said second frequency operates in said second low band.

16. The circuit of claim 8 wherein a television channel in said RF signals has an RF picture carrier at a first carrier frequency and an RF audio carrier at a second carrier frequency, wherein said second carrier frequency is at a higher frequency than said first carrier frequency; and wherein a corresponding television channel in said IF signals has an IF picture carrier at a first IF carrier frequency and an IF audio carrier at a second IF carrier frequency, wherein said second IF carrier frequency is at a higher frequency than said first IF carrier frequency.

17. A local oscillator circuit for a conversion circuit that converts Radio Frequency (RF) signals to Intermediate Frequency (IF) signals comprising:

means for generating a first local oscillator signal;

means for generating a second local oscillator signal; and means for selecting frequencies of said first and second local oscillator signals, wherein said selecting means selects said frequencies so that spurious signals generated in said local oscillator circuit do not interfere with a received RF signal and so that said IF signals have a desired frequency relationship.

18. The circuit of claim 17 wherein said means for generating said first local oscillator signal comprises a first voltage controlled oscillator that is controlled by a first phase locked loop.

19. The circuit of claim 18 wherein said spurious signals are generated in said first phase locked loop.

20. The circuit of claim 18 wherein said means for generating said second local oscillator signal comprises a second voltage controlled oscillator that is controlled by a second phase locked loop.

21. The circuit of claim 20 wherein said spurious signals are generated in said second phase locked loop.

22. The circuit of claim 20 wherein said means for generating said second local oscillator signal further comprises a third voltage controlled oscillator controlled by a third phase locked loop, and wherein said third voltage controlled oscillator provides a first reference signal to said second phase locked loop.

23. The circuit of claim 22 wherein said first reference signal is selectable between either a high frequency signal that causes said second local oscillator signal to operate in a high frequency band, or a low frequency signal that causes said second local oscillator signal to operated in a low frequency band.

24. The circuit of claim 22 wherein said spurious signals are generated in said third phase locked loop.

25. The circuit of claim 22 wherein said means for generating said second local oscillator signal further comprises a fourth voltage controlled oscillator controlled by a fourth phase locked loop, and wherein said fourth voltage controlled oscillator provides a second signal to said second phase locked loop.

26. The circuit of claim 25 wherein said second reference signal provides fine tuning for said second local oscillator signal.

27. The circuit of claim 25 wherein said spurious signals are generated in said fourth phase locked loop.

28. The circuit of claim 17 wherein said first and second local oscillator signals are selected so that said desired spectral relationship corresponds to a frequency relationship of said RF signals.

29. The circuit of claim 17 wherein said desired frequency relationship of said IF signals is the inverse of a frequency relationship of said RF signals.

30. A method of providing local oscillator signals for a conversion circuit in which Radio Frequency (RF) signals having a first a first frequency relationship are converted to Intermediate Frequency (IF) signals having a second frequency relationship, said method comprising the steps of:

generating one or more local oscillator signals, each of said local oscillator signals having a frequency; and selecting said frequency of said one or more local oscillator signals so that a channel in said RF signals appears within a selected range of frequencies in said IF signals, wherein said frequency of said one or more local oscillator signals is selected in said selecting step so that spurious signals do not interfere with said channel in said RF signal and so that said IF signals have a desired second frequency relationship.

31. The method of claim 30 wherein said selecting step selects said first frequency of said one or more local oscillator signals so that signals in a channel in said IF signal have the same frequency relationship as corresponding signals in said channel in said RF signal.

32. The method of claim 30 wherein said selecting step selects said first frequency of said one or more local oscillator signals so that signals in a channel in said IF signal have an inverse frequency relationship compared to corresponding signals in said channel in said RF signal.

33. The method of claim 30 wherein each of said one or more local oscillator signals are generated in a phase locked loop; and wherein said spurious signals are generated in one of said phase locked loops.

34. The method of claim 30 wherein a plurality of local oscillator signals are generated, each of said plurality of local oscillator signals having a different frequency, and wherein each of said local oscillator signals generates an IF signal within a different frequency range.

* * * * *